(12) United States Patent
Kinoshita et al.

(10) Patent No.: US 9,579,746 B2
(45) Date of Patent: Feb. 28, 2017

(54) THERMOCOMPRESSION BONDING STRUCTURE AND THERMOCOMPRESSION BONDING METHOD

(71) Applicant: FUJI ELECTRIC CO., LTD., Kawasaki-shi (JP)

(72) Inventors: Yoshito Kinoshita, Nagano (JP); Eiji Mochizuki, Matsumoto (JP); Tatsuo Nishizawa, Matsumoto (JP); Shinji Tada, Hino (JP)

(73) Assignee: FUJI ELECTRIC CO., LTD., Kawasaki-Shi (JP)

( * ) Notice: Subject to any disclaimer, the term of this patent is extended or adjusted under 35 U.S.C. 154(b) by 17 days.

(21) Appl. No.: 14/224,738

(22) Filed: Mar. 25, 2014

(65) Prior Publication Data
US 2014/0301769 A1 Oct. 9, 2014

(30) Foreign Application Priority Data

Apr. 5, 2013 (JP) ................................. 2013-079770

(51) Int. Cl.
*B23K 20/02* (2006.01)
*H01L 29/00* (2006.01)
(Continued)

(52) U.S. Cl.
CPC ............ *B23K 20/026* (2013.01); *B23K 20/16* (2013.01); *B23K 20/233* (2013.01); *B23K 2201/40* (2013.01); *B23K 2203/10* (2013.01); *B23K 2203/12* (2013.01); *B23K 2203/14* (2013.01); *B23K 2203/18* (2013.01); *H01L 2924/0002* (2013.01); *Y10T 403/217* (2015.01)

(58) Field of Classification Search
None
See application file for complete search history.

(56) References Cited

U.S. PATENT DOCUMENTS 3,160,480 A * 12/1964 Alliegro ............ B23K 35/3006
428/472
3,949,466 A * 4/1976 O'Brien .................. H01R 4/62
174/94 R
(Continued)

FOREIGN PATENT DOCUMENTS

JP 2001-010873 A 1/2001
JP 2011-249562 A 12/2011
(Continued)

OTHER PUBLICATIONS

Japan Patent Office, "Office Action for Japanese Patent Application No. 2013-079770," Dec. 20, 2016.

*Primary Examiner* — Devang R Patel
(74) *Attorney, Agent, or Firm* — Manabu Kanesaka

(57) ABSTRACT

A thermocompression bonding structure includes a first member and a second member having a linear expansion coefficient different from that of the first member; and metal fine particles interposed between the first and second members as a bonding material to thermocompression bond the two members. The two members are disposed to apply thermal stress generating between the first member and the second member as pressurizing force on a bonding surface between the two members, and to increase temperature to thermocompression bond the first member and the second member.

4 Claims, 9 Drawing Sheets

(51) Int. Cl.
*B23K 20/16* (2006.01)
*B23K 20/233* (2006.01)

(56) References Cited

U.S. PATENT DOCUMENTS

| | | | | |
|---|---|---|---|---|
| 4,098,449 | A * | 7/1978 | Noesen | B23K 20/2333 |
| | | | | 228/115 |
| 4,857,411 | A * | 8/1989 | Yamaguchi | B22F 7/06 |
| | | | | 228/122.1 |
| 6,348,273 | B1 | 2/2002 | Ishikawa et al. | |
| 6,492,037 | B2 * | 12/2002 | Shindo | B23K 20/22 |
| | | | | 200/238 |
| 2009/0032570 | A1 * | 2/2009 | Matsumura | B30B 5/02 |
| | | | | 228/123.1 |
| 2012/0064664 | A1 * | 3/2012 | Yamazaki | H01L 29/7869 |
| | | | | 438/104 |
| 2012/0074563 | A1 * | 3/2012 | Iizuka | B23K 1/0016 |
| | | | | 257/737 |
| 2013/0175324 | A1 * | 7/2013 | Chang | H01L 24/75 |
| | | | | 228/101 |

FOREIGN PATENT DOCUMENTS

| | | | |
|---|---|---|---|
| JP | 2012-049398 A | | 3/2012 |
| JP | 2012049398 A | * | 3/2012 |

* cited by examiner

Fig. 3A
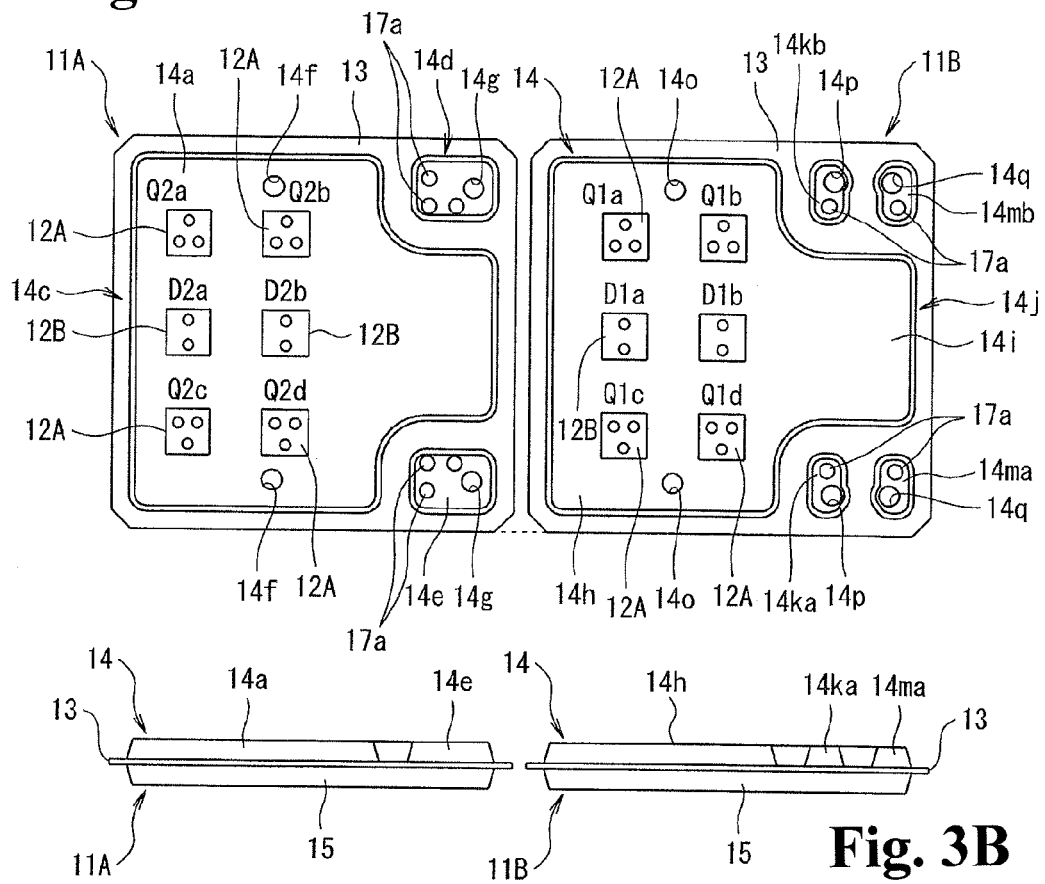
Fig. 3B
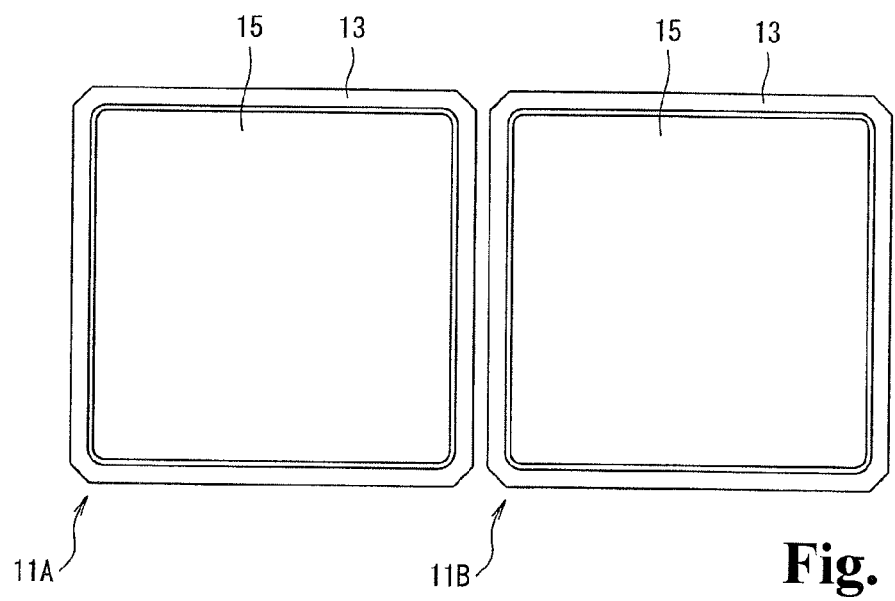
Fig. 3C

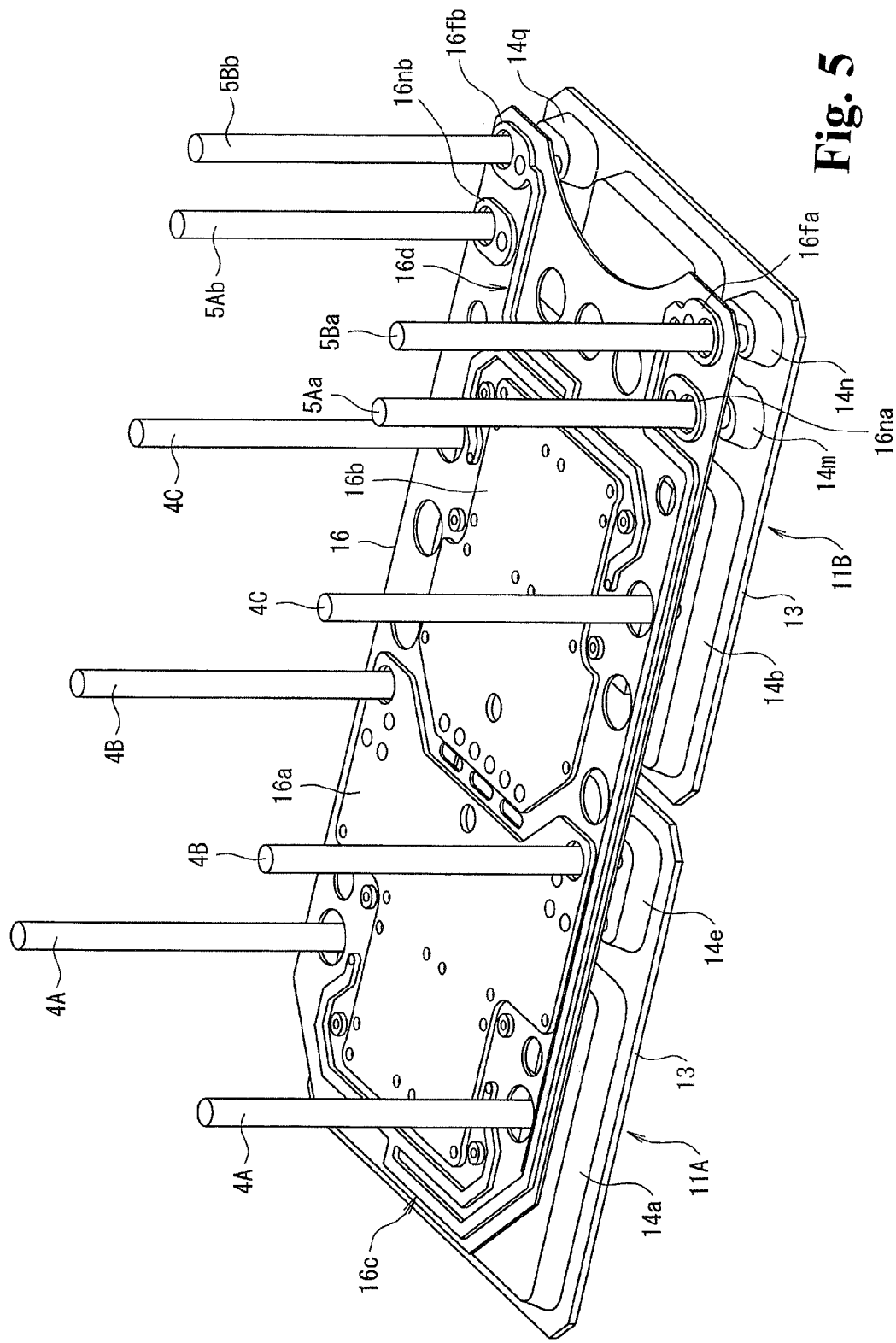

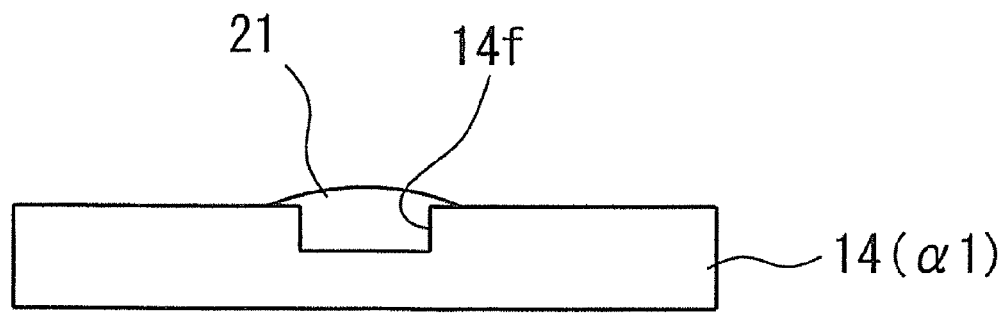
Fig. 6A
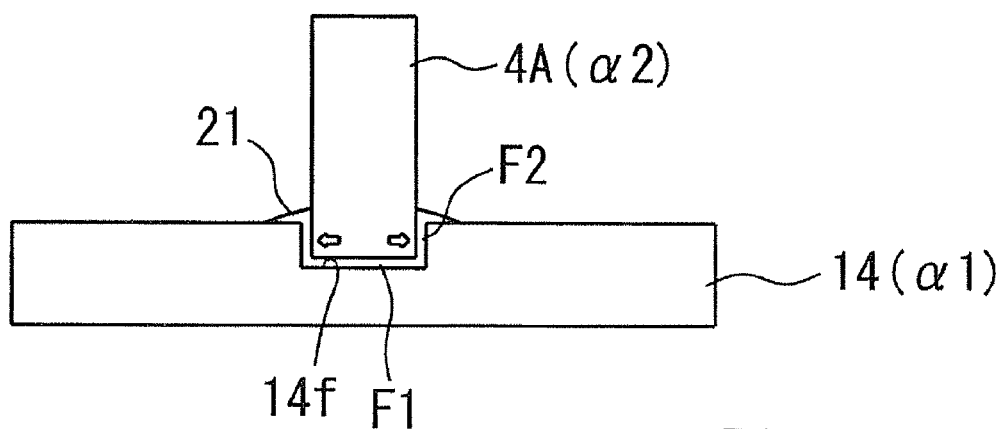
Fig. 6B

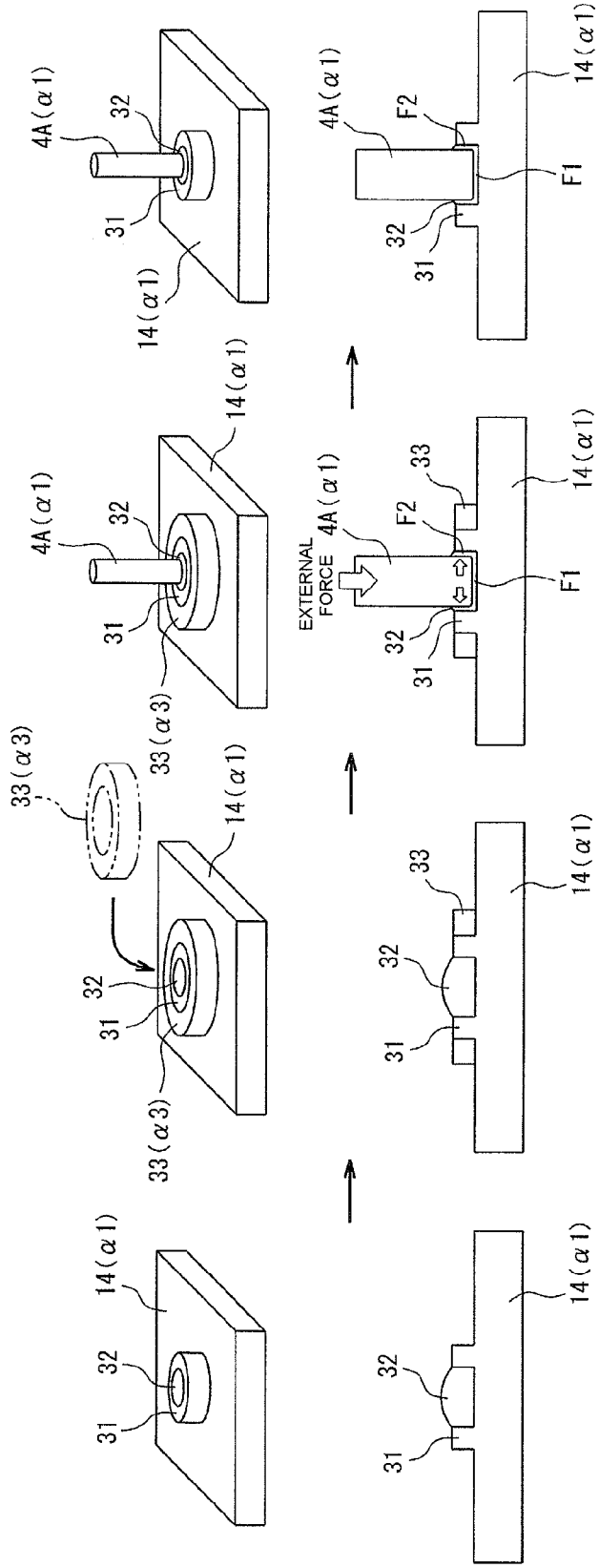

THERMOCOMPRESSION BONDING STRUCTURE AND THERMOCOMPRESSION BONDING METHOD

RELATED APPLICATIONS

The present application is based on, and claims priority from, Japanese Application No. JP2013-079770 filed Apr. 5, 2013, the disclosure of which is hereby incorporated by reference herein in its entirety.

BACKGROUND OF THE INVENTION

Field of the Invention

The present invention relates to a thermocompression bonding structure and a thermocompression bonding method in which two members are pressurized and heated to be bonded to each other by use of metal fine particles.

Description of the Background Art

For this kind of thermocompression bonding technique, for example, a technique described in JP-A-2011-249562 has been proposed. According to the thermocompression bonding technique, electrode terminals of substrates to be stacked are bonded with each other as follows. That is, a transistor and multilayer wiring are formed on a substrate, and an insulating film is formed to cover the multilayer wiring. An opening portion is formed to expose the wiring in the insulating film, and an organic solvent including conductive fine particles is applied to the interior of the opening portion. After first heat treatment is performed to eliminate the solvent and an organic component, the conductive fine particles are eliminated from an outer part of the opening portion by a CMP method so that an electrode terminal formed from the conductive fine particles is formed inside the opening portion. A through electrode formed in a second substrate is pressed and pushed against the electrode terminal. Second heat treatment higher in temperature than the first heat treatment is performed to partially melt the conductive fine particles to thereby bond the through electrode to the opening portion.

According to the aforementioned thermocompression bonding method described in JP-A-2011-249562, an electrode inserted into a bonding recess formed on the substrate side is heated while being pressurized in the insertion direction of the electrode so that thermocompression bonding can be attained between the electrode and the bonding recess. In this case, the pressurizing direction of the electrode inserted inside the bonding recess coincides with the insertion direction of the electrode so that the pressurizing force acts on a bonding surface between the bottom of the bonding recess and the bottom of the electrode. Accordingly, the pressure bonding in the bonding surface can be performed excellently. However, the pressurizing force does not act on a side bonding surface between a side wall of the bonding recess and an outer circumferential surface of the electrode. Thus, there still remains an unsolved problem that thermocompression bonding cannot be achieved in the side bonding surface.

SUMMARY OF THE INVENTION

Therefore, the invention has been accomplished to solve the unsolved problem inherent in the background art. An object of the invention is to provide a thermocompression bonding structure and a thermocompression bonding method in which thermocompression bonding can be achieved evenly in a bonding surface perpendicular to a pressurizing direction.

In order to achieve the object, a first aspect of the thermocompression bonding structure according to the invention is a thermocompression bonding structure formed by thermocompression bonding between two members using metal fine particles as a bonding material. In the thermocompression bonding structure, a first member and a second member having different linear expansion coefficients from each other are disposed so that thermal stress occurring between the first member and the second member acts as pressurizing force on a bonding surface between the two members. The temperature of the first member and the second member between which the metal fine particles are interposed in the bonding surface is increased to thermocompression bond the first member and the second member.

In addition, a second aspect of the thermocompression bonding structure according to the invention is a thermocompression bonding structure formed by thermocompression bonding between two members using metal fine particles as a bonding material. In the thermocompression bonding structure, the two members comprise a first member with a smaller linear expansion coefficient and a second member with a larger linear expansion coefficient. A bonding recess is formed on the first member. The temperature of the first member and the second member engaged with the bonding recess through the metal fine particles is increased to apply pressurizing force to a bonding portion between the first member and the second member using thermal stress occurring between the first member and the second member to thereby achieve thermocompression bonding between the first member and the second member.

In addition, in a third aspect of the thermocompression bonding structure according to the invention, the first member is a conductive plate material formed with the bonding recess having a circular cross-section, and the second member is a terminal member having a columnar shape.

In addition, a fourth aspect of the thermocompression bonding structure according to the invention is a thermocompression bonding structure formed by thermocompression bonding between two members using metal fine particles as a bonding material. The thermocompression bonding structure includes: a third member including an annular protrusion having a fitting recess formed in a center portion thereof; a fourth member fitted into the fitting recess of the third member and whose linear expansion coefficient is not smaller than a linear expansion coefficient of the third member; and a pressing jig whose linear expansion coefficient is smaller than the linear expansion coefficient of the third member and provided with an engagement hole to be engaged with an outer circumferential surface of the annular protrusion of the third member. The fourth member is disposed in the fitting recess of the third member through the metal fine particles. The temperature of the third member, the fourth member, and the pressing jig attached to the outer circumferential surface of the third member is increased while the pressing jig restrains the third member and the fourth member from thermally expanding, so that pressurizing force is applied to a bonding surface between the third member and the fourth member to thermocompression bond the third member and the fourth member.

In addition, in a fifth aspect of the thermocompression bonding structure according to the invention, the third member is a conductive plate material formed with the annular protrusion having a circular cross-section, and the fourth member is a terminal member having a columnar shape.

In addition, a first aspect of the thermocompression bonding method according to the invention includes: disposing a first member and a second member which have different linear expansion coefficients from each other and which will be bonded to each other, so that thermal stress generating between the first member and the second member at the time of temperature increase can act as pressurizing force on a bonding surface between the first member and the second member; and increasing the temperature of the first member and the second member between which the metal fine particles are interposed in the bonding surface, so that thermocompression bonding can be achieved between the first member and the second member.

In addition, a second aspect of the thermocompression bonding method according to the invention includes: preparing a first member formed with a bonding recess and a second member whose linear expansion coefficient is larger than a linear expansion coefficient of the first member, and engaging the second member with the bonding recess of the first member through metal fine particles used as a bonding material; and increasing the temperature of the first member and the second member engaged with the bonding recess of the first member through the metal fine particles, so as to apply pressurizing force to a bonding portion between the first member and the second member using thermal stress occurring between the first member and the second member to thermocompression bond the first member and the second member.

In addition, a third aspect of the thermocompression bonding method according to the invention includes: preparing a third member formed with an annular protrusion having a bonding recess in a center portion thereof, a fourth member bonded to the bonding recess of the third member and having linear expansion coefficient not smaller than a linear expansion coefficient of the third member, and a pressing jig whose linear expansion coefficient is smaller than the linear expansion coefficient of the third member and which is provided with an engagement hole to be engaged with an outer circumferential edge of the annular protrusion of the third member, attaching the pressing jig to an outer circumferential surface of the third member, and disposing the fourth member in the bonding recess of the third member through metal fine particles used as a bonding material to thereby set the third member, the fourth member and the pressing jig into a pre-bonding state; and increasing the temperature of the third member, the fourth member, and the pressing jig in the pre-bonding state and retraining the third member and the fourth member from thermally expanding by means of the pressing jig to apply pressurizing force to a bonding surface between the third member and the fourth member to thereby thermocompression bond the third member and the fourth member.

According to the invention, linear expansion coefficients of two members between which thermocompression bonding is to be achieved are made different from each other. Accordingly, thermal stress can be generated due to a difference between the linear expansion coefficients at the time of temperature increase so that pressurizing force generated by the thermal stress can act on a bonding surface. Even when the bonding surface is a side surface etc., the pressurizing force can act on the bonding surface so surely that thermocompression bonding between the two members can be achieved surely in the bonding surface.

In addition, according to the invention, a pressing jig whose linear expansion coefficient is smaller than each of the linear expansion coefficients of the two members between which thermocompression bonding is to be achieved is used to restrain to-be-bonded parts of the two members from outside so that thermal expansion of the outer one of the members can be turned toward the inner member side so that pressurizing force can act on the bonding surface. Accordingly, even when the bonding surface is a side surface etc., the pressurizing force can act on the bonding surface so surely that thermocompression bonding between the two members can be achieved surely in the bonding surface.

BRIEF DESCRIPTION OF THE DRAWINGS

FIGS. 3A-3C are views showing insulating boards, in which FIG. 3A is a plan view, FIG. 3B is a side view, and FIG. 3C is a bottom view.

FIGS. 4A and 4B are views showing a printed board applied to FIG. 1, in which FIG. 4A is a plan view and FIG. 4B is a bottom view.

FIG. 5 is a perspective view showing a state in which the printed board is mounted on the insulating substrates.

FIGS. 6A and 6B are views showing steps of a first embodiment of a thermocompression bonding method according to the invention.

FIGS. 8A-8D are views showing steps of a second embodiment of the thermocompression bonding method according to the invention.

DETAILED DESCRIPTION OF THE INVENTION

Embodiments in which a thermocompression bonding structure and a thermocompression bonding method according to the invention are applied to a power semiconductor module as a semiconductor device will be described below with reference to the drawings.

FIGS. 1-6B are views showing a first embodiment in which the invention is applied to a power semiconductor module as a semiconductor device.

Figure 1:
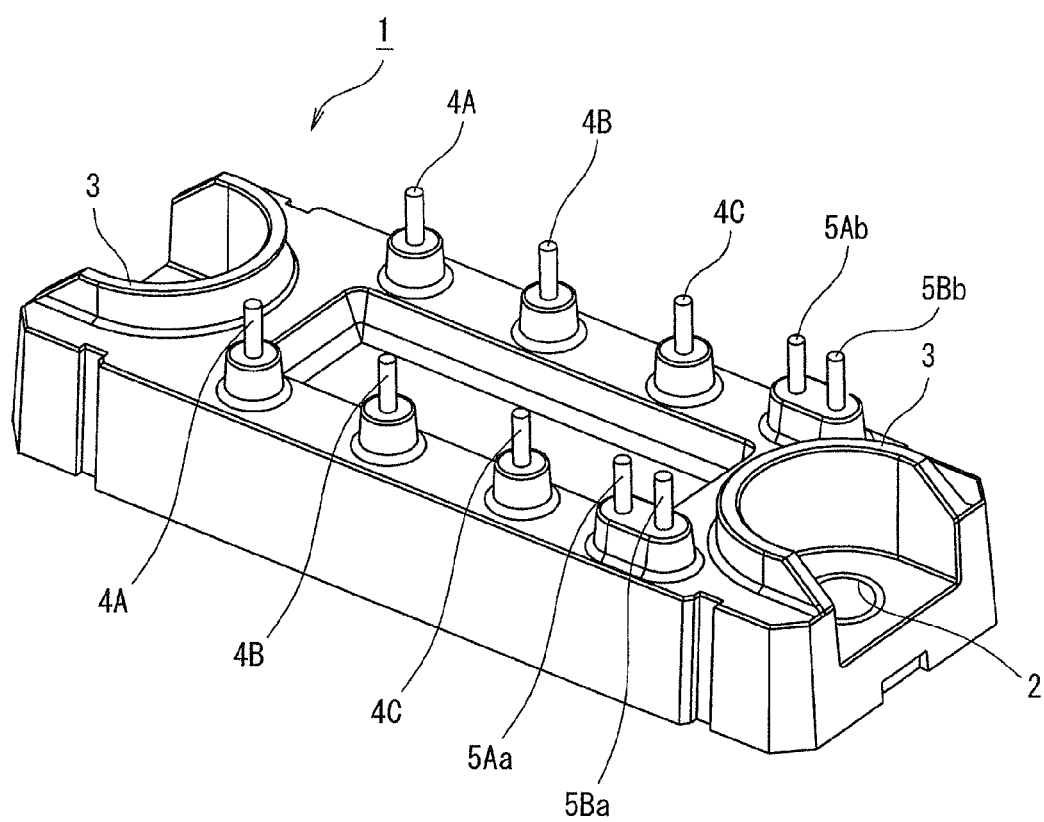
FIG. 1 is a perspective view showing a semiconductor device to which thermocompression bonding according to the invention can be applied.
Figure 2:
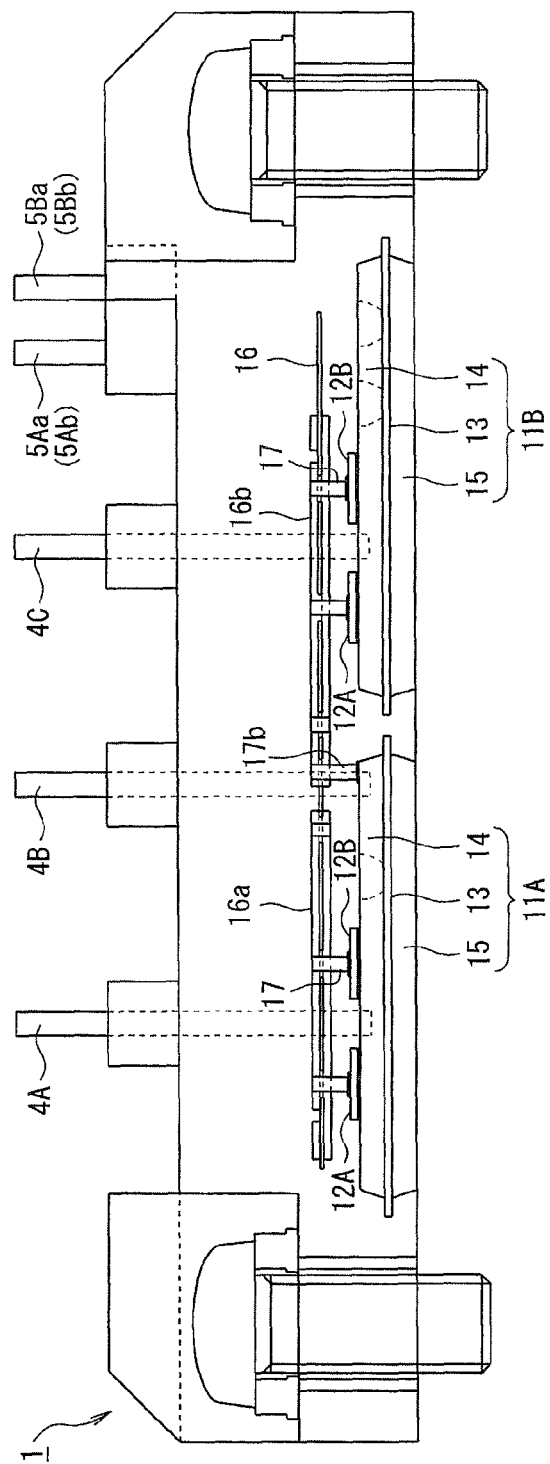
FIG. 2 is a vertical cross-sectional view of FIG. 1.

An example of a power semiconductor module 1 to which the invention can be applied is arranged as a molded product which is molded from a resin material such as an epoxy resin, as shown in FIG. 1. In the power semiconductor module 1, insertion holes 2 through which fixing screws can be inserted are formed in left and right end portions, and insulating wall portions 3 each having a U-shape in a plan view are formed to surround the insertion holes 2.

In addition, external connection terminals 4A, 4B, and 4C and control terminals 5Aa, 5Ab and 5Ba, 5Bb are formed to protrude upward on the front and rear end portion sides between the left and right insulating wall portions 3 in an upper surface of the power semiconductor module 1. The terminals 4A, 4B, 4C, 5Aa, 5Ab, 5Ba, and 5Bb are formed into pin-shaped columnar bodies having the same configurations and serving as second members respectively. The external connection terminals 4A, 4B, and 4C and the control terminals 5Aa, 5Ab and 5Ba, 5Bb are electrically connected to semiconductor chips 12A and 12B serving as main circuit constituent components mounted on insulating boards 11A and 11B serving as built-in first members.

The insulating board 11A has a substrate 13 which is, for example, formed into a square shape and which contains, as a main component, ceramics such as alumina with a good heat transfer property. A conductor pattern 14 made of a copper plate with a thickness of 0.5 mm or more is attached to a front surface of the substrate 13. A heat radiation heat transfer pattern 15 made of a copper plate with the same thickness is attached to a back surface of the substrate 13.

As shown in FIGS. 3A-3C, the conductor pattern 14 has a chip mounting pattern 14c which is formed into a convex shape as its planar shape. The chip mounting pattern 14c includes a wide portion 14a formed in its left end portion, and a narrow portion 14b connecting to the right side of the wide portion 14a. The wide portion 14a has substantially the same width as the substrate 13. The narrow portion 14b has a narrower width than the wide portion 14a. In addition, the conductor pattern 14 has independent terminal connection patterns 14d and 14e which are arranged on the opposite sides outside the narrow portion 14b of the chip mounting pattern 14c respectively so as to keep a predetermined distance therebetween. Side edges of these terminal connection patterns 14d and 14e are aligned with side edges of the wide portion 14a of the chip mounting pattern 14c. As shown in FIG. 3A, first semiconductor chips 12A and second semiconductor chips 12B are mounted on the wide portion 14a of the chip mounting pattern 14c through a bonding member such as solder. In addition, bonding recesses 14f in which thermocompression bonding with the external connection terminals 4A for a main circuit should be achieved are formed on the widthwise opposite sides outside the first semiconductor chips 12A in the chip mounting pattern 14c. Moreover, bonding recesses 14g to thermocompression bond with the external connection terminals 4B are formed in the terminal connection patterns 14d and 14e.

In addition, in the same manner as the insulating board 11A, the insulating board 11B also has a substrate 13 containing ceramics as a main component, and a conductor pattern 14 and a heat radiation heat transfer pattern 15 formed in the front and back of the substrate 13 respectively. A chip mounting pattern 14j formed into a convex shape as its planar shape and two terminal connection patterns 14ka, 14kb and 14ma, 14mb are formed in the conductor pattern 14, in the same manner as in the insulating board 11A. The chip mounting pattern 14j has a wide portion 14h and a narrow portion 14i. The two terminal connection patterns 14ka, 14kb and 14ma, 14mb are formed independently on the opposite sides outside the narrow portion 14i of the chip mounting pattern 14j respectively so as to keep a predetermined distance therebetween.

As shown in FIG. 3A, first semiconductor chips 12A and second semiconductor chips 12B are mounted on the chip mounting pattern 14j through a bonding member such as solder. In addition, bonding recesses 14o each of which is shaped like a circle in section to thermocompression bond with the external connection terminals 4C are formed on the widthwise opposite sides outside the first semiconductor chips 12A in the chip mounting pattern 14j.

Further, bonding recesses 14p and 14q to thermocompression bond with the control terminals 5Aa, 5Ab and 5Ba, 5Bb are formed in the terminal connection patterns 14ka, 14kb and 14ma, 14mb.

Here, the external connection terminals 4A, 4B, 4C and the control terminals 5Aa, 5Ab, 5Ba, 5Bb are pressurized and heated to be bonded to the bonding recesses 14f, 14g, 14o and 14p, 14q of the conductor patterns 14 of the insulating boards 11A and 11B. For this reason, it is desirable that the material of the external connection terminals 4A, 4B, 4C and the control terminals 5Aa, 5Ab, 5Ba, 5Bb is an aluminum (Al)-based material whose linear expansion coefficient ($\alpha 2 = 23.1 \times 10^{-6}$) is larger than the linear expansion coefficient ($\alpha 1 = 16.5 \times 10^{-6}$) of copper (Cu) forming the conductor patterns 14 to be bonded thereto. However, when easiness in solder bonding is taken into consideration, nickel (Ni) or tin(Sn)-based surface treatment may be applied to the external connection terminals 4A, 4B, 4C and the control terminals 5Aa, 5Ab, 5Ba, 5Bb to improve the wettability for the solder bonding so that the mounting efficiency can be increased.

Thermocompression bonding of the external connection terminals 4A, 4B, 4C and the control terminals 5Aa, 5Ab, 5Ba, 5Bb to the bonding recesses 14f, 14g, 14o and 14p, 14q of each of the conductor patterns 14 is achieved as shown in FIGS. 6A and 6B.

Bonding between the external connection terminal 4A and the bonding recess 14f of the conductor pattern 14 will be described as a representative of the thermocompression bonding. As shown in FIG. 6A, for example, metal fine particle containing adhesive 21 which contains metal fine particles such as silver (Ag) fine particles is first applied as a bonding member to the bonding recess 14f so as to bulge out from the bonding recess 14f.

Here, a paste-like member in which the surfaces of metal fine particles such as Ag fine particles dispersed in a volatile binder material are covered with the binder material may be used as the metal fine particle containing adhesive 21. In addition to silver (Ag), copper (Cu) may be used as the metal fine particles. For example, an organic substance containing at least one kind of carboxylic acids, alcohols and amines may be used as the binder material.

Next, for example, the external connection terminal 4A whose outer diameter is slightly smaller than an inner diameter of the bonding recess 14f is inserted into the metal fine particle containing adhesive 21 in the bonding recess 14f, as shown in FIG. 6B. A dimensional difference between the inner diameter of the bonding recess 14f and the outer diameter of the external connection terminal 4A is set so that pressurizing force can act on a circumferential bonding surface F2 between the bonding recess 14f and the external connection terminal 4A due to a difference in thermal expansion between the bonding recess 14f and the external connection terminal 4A at the time of temperature rising to a predetermined rising temperature.

An upper end of the external connection terminal 4A inserted into the bonding recess 14f is pressurized by a predetermined jig. In this state, the external connection terminal 4A is heated by a heater provided in the jig, or inputted in a heating furnace. Thus, the temperature of a bonding portion is increased, for example, to about 250° C. to 300° C. The binder component is decomposed from the metal fine particle containing adhesive 21 by heating so that the metal fine particles are exposed. On this occasion, the linear expansion coefficient $\alpha 2$ of the external connection terminal 4A is set to be larger than the linear expansion coefficient $\alpha 1$ of the conductor pattern 14. Accordingly, due to temperature rising from room temperature, the radial thermal expansion amount of the external connection terminal 4A is larger than the radial thermal expansion amount of the bonding recess 14f. Therefore, an outer circumferential surface of the external connection terminal 4A makes pressure contact with an inner surface of the bonding recess 14f so as to generate thermal stress. The thermal stress acts as pressurizing force on a circumferential bonding surface F2 between the outer surface of the external connection terminal 4A and the inner surface of the bonding recess 14f. The binder component is decomposed from the metal fine particle containing adhesive 21 so that the metal fine particles are exposed. Accordingly, the exposed metal fine particles are sintered in the place where the pressurizing force acts on the circumferential bonding surface F2 between the outer circumferential surface of the external connection terminal 4A and the inner circumferential surface of the bonding recess 14f. Bonding in the circumferential bonding surface F2 can be also achieved surely even without any pressurizing force applied from the outside.

It is a matter of course that the pressurizing force is made to act on a bottom bonding surface F1 between the bottom of the external connection terminal 4A and the bottom of the bonding recess 14f from the upper end side of the external connection terminal 4A by the jig. Accordingly, the metal fine particles also exposed in the bottom bonding surface F1 are sintered so that bonding between the external connection terminal 4A and the bonding recess 14f can be achieved surely.

Then, the rise of temperature in the external connection terminal 4A and the conductor pattern 14 by the heater or the heating furnace is stopped to reduce the temperature to the room temperature. During the reduction of the temperature, the metal fine particles are solidified so that the external connection terminal 4A and the bonding recess 14f are bonded to each other surely. Thus, a thermocompression bonding structure is formed.

Simultaneously with the thermocompression bonding of the external connection terminal 4A, the other external connection terminals 4B, 4C and the control terminals 5Aa, 5Ab, 5Ba, 5Bb inserted into the bonding recesses 14g, 14o and 14p, 14q and axially pressurized by the jig are also increased in temperature. In this manner, metal fine particles in bottom bonding surfaces F1 and circumferential bonding surfaces F2 are sintered to achieve thermocompression bonding therein. Thus, thermocompression bonding structures are formed.

In addition, an IGBT (Insulated Gate Bipolar Transistor) (or a power MOSFET (Metal-Oxide-Semiconductor Field-Effect Transistor) serving as a power semiconductor device is formed as each semiconductor chip 12A. A free wheeling diode (FWD) is formed as each semiconductor chip 12B.

The semiconductor chip 12A has a collector electrode formed in its lower surface, and an emitter electrode and a gate electrode formed in its upper surface. On the other hand, the semiconductor chip 12B has a cathode electrode formed in its lower surface and an anode electrode formed in its upper surface.

Figure 4A:
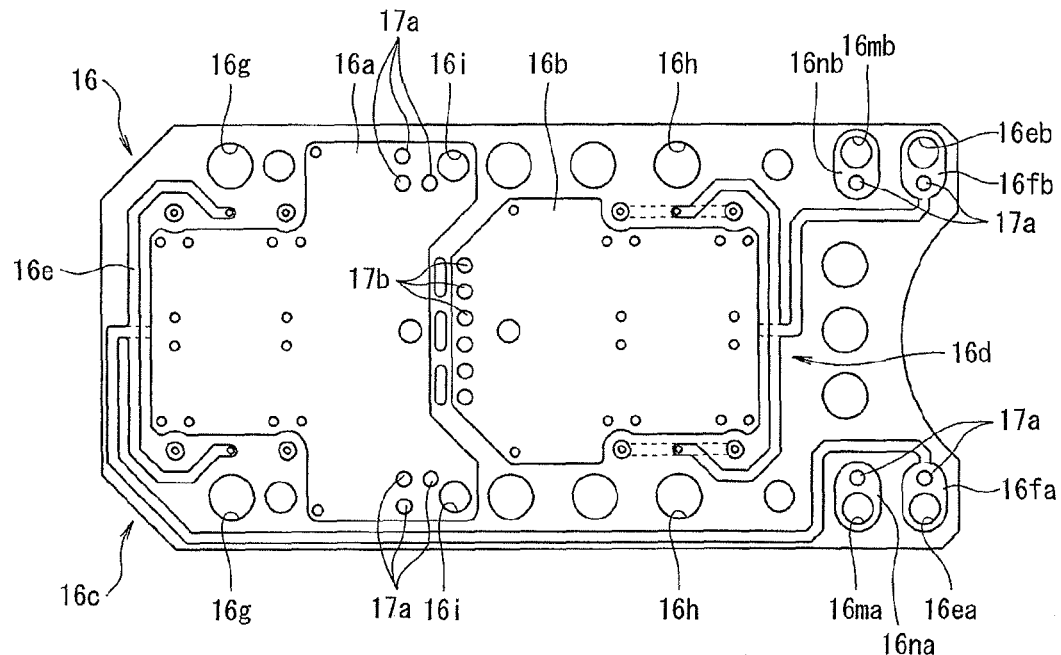
Figure 4B:
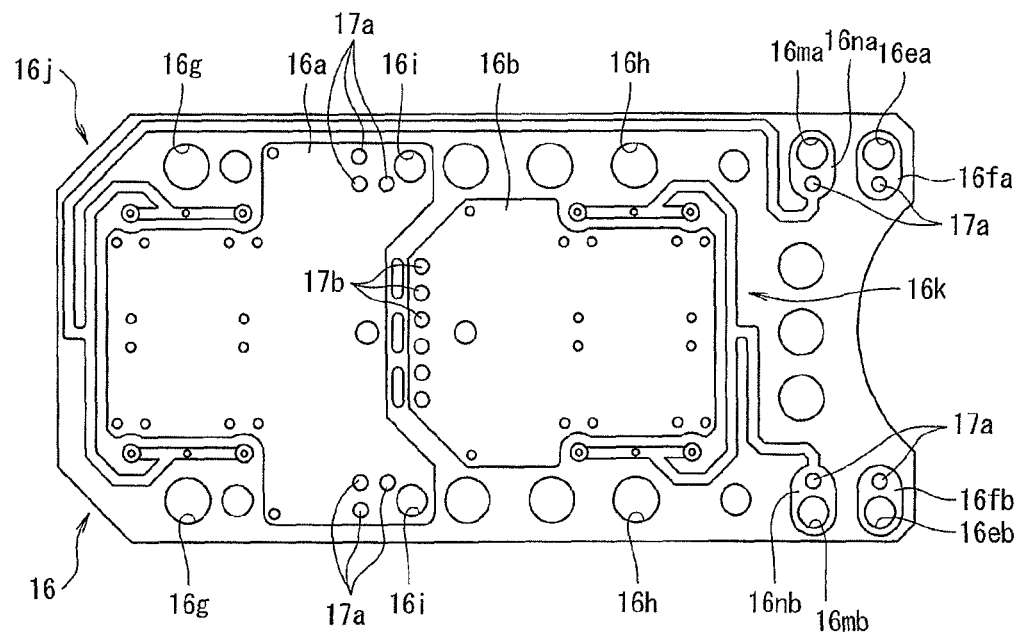

In addition, a printed board 16 is disposed above the insulating boards 11A and 11B so as to keep a predetermined distance therefrom. As shown in FIGS. 4A and 4B, a conductive pattern 16a having a wide width and formed into a convex shape toward the lea side so as to serve as a main circuit current path and a conductor pattern 16b having a wide width likewise so as to serve as a main circuit current path are formed on the front surface side of the printed board 16. Gate wirings 16c and 16d which are to be connected to the gate electrodes of the first semiconductor chips 12A through post electrodes 17 are formed in the front surface of the printed board 16. The gate wirings 16c and 16d are connected to terminal connection patterns 16fa and 16fb formed around insertion holes 16ea and 16eb which are formed on the right end side and to which the control terminals 5Ba and 5Bb are to be inserted.

In addition, simple insertion holes 16g and 16h through which the external connection terminals 4A and 4C can be inserted in a non-contact manner and through holes 16i through which the external connection terminals 4B can be inserted in a non-contact manner are bored in the printed board 16.

Further, as shown in FIG. 4B, conductive patterns 16a and 16b having wide widths and formed into convex shapes toward the left side so as to serve as main circuit current paths are formed in a back surface of the printed board 16 so that the conductive patterns 16a and 16b on the back side overlap the conductive patterns 16a and 16b on the front side in a plan view. In addition, emitter auxiliary terminal wirings 16j and 16k which are to be connected to a cathode of a diode D2a of the chip mounting pattern 14c constituting a main circuit and a cathode of a diode D1b of the chip mounting pattern 14j constituting a main circuit through post electrodes 17 are formed in the back surface of the printed board 16. The emitter auxiliary terminal wirings 16j and 16k are formed so as to overlap the gate wirings 16c and 16d on the front side in a plan view. The emitter auxiliary terminal wirings 16j and 16k are connected to terminal connection patterns 16na and 16nb formed around insertion holes 16ma and 16mb which are formed on the right end side and to which the control terminals 5Aa and 5Ab are to be inserted.

Here, of the conductive patterns 16b on the front and back sides of the printed board 16, end portions near to the conductive patterns 16a are electrically connected to the narrow portion 14b of the chip mounting pattern 14c of the insulating board 11A by a plurality of (for example, six) post electrodes 17b serving as rod-like conductive connection members so that a current path between the main circuits is formed by the post electrodes 17b.

In addition, the conductive patterns 16a on the front and back sides of the printed board 16 are set at the same potential. Similarly, the conductive patterns 16b on the front and back sides of the printed board 16 are also set at the same potential.

As shown in FIG. 5, the insulating boards 11A and 11B are bonded to the printed board 16 in the state in which the external connection terminals 4A to 4C and the control terminals 5Aa, 5Ab and 5Ba, 5Bb bonded to the insulating boards 11A and 11B by thermocompression bonding are kept perpendicular thereto, as described above. In this case, the external connection terminals 4A, 4B, 4C and the control terminals 5Aa, 5Ab and 5Ba, 5Bb are inserted into the insertion holes 16g, 16i, 16h, 16ma, 16mb, 16ea and 16eb bored in the printed board 16.

On this occasion, the post electrodes 17 serving as the rod-like conductive connection members formed in the printed board 16 contact first and second semiconductor chips 12A and 12B and the conductor patterns 14 through a bonding member such as solder. When reflow treatment is applied in this state, the post electrodes 17 of the printed board 16 are electrically and mechanically bonded to the first and second semiconductor chips 12A and 12B and the conductor patterns 14. Simultaneously with this, the insertion holes 16i, 16ma, 16mb, 16ea and 16eb and the external connection terminals 4B and the control terminals 5Aa, 5Ab and 5Ba, 5Bb are electrically bonded to each other through post electrodes 17a serving as rod-like connection members.

The collector electrodes of the semiconductor chips 12A and the cathode electrodes of the semiconductor chip 12B mounted on the chip mounting pattern 14c are connected to the external connection terminals 4A through the chip mounting pattern 14c. In addition, the emitter electrodes of the semiconductor chips 12A and the anode electrodes of the semiconductor chips 12B mounted on the chip mounting pattern 14c are electrically connected to the conductive patterns 16a of the printed board 16 through the post electrodes 17 and further connected therefrom to the external connection terminals 4B through the post electrodes 17a.

Further, the collector electrodes of the semiconductor chips 12A and the cathode electrodes of the semiconductor chips 12B mounted on the chip mounting pattern 14j are connected to the external connection terminals 4C. The emitter electrodes of the semiconductor chips 12A and the anode electrodes of the semiconductor chips 12B mounted on the chip mounting pattern 14j are connected to the external connection terminals 4A via the post electrodes 17, the conductive patterns 16b of the printed board 16, the post electrodes 17b and the chip mounting pattern 14c.

In addition, the gate electrodes of the semiconductor chips 12A mounted on the chip mounting pattern 14c are connected to the control terminal 5Ba through the post electrodes 17 and through the gate wiring 16c of the printed board 16. Similarly, the gate electrodes of the semiconductor chips 12A mounted on the chip mounting pattern 14j are connected to the control terminal 5Bb through the post electrodes 17 and through the gate wiring 16d of the printed board 16.

Further, the emitter electrodes of the semiconductor chips 12A mounted on the chip mounting pattern 14c are connected to the control terminal 5Aa through the post electrodes 17 and through the emitter auxiliary terminal wiring 16j of the printed board 16. Similarly, the emitter electrodes of the semiconductor chips 12A mounted on the chip mounting pattern 14j are connected to the control terminal 5Ab through the post electrodes 17 and through the emitter auxiliary terminal wiring 16k of the printed board 16.

The insulating boards 11A and 11B and the printed board 16 which have been bonded to each other are inserted into a predetermined mold and a material of a thermosetting resin such as an epoxy resin is injected thereto and molded. Thus, the power semiconductor module 1 shown in FIG. 1 is formed.

In this manner, according to the first embodiment, the external connection terminals 4A, 4B and the external connection terminals 4C, and the control terminals 5Aa, 5Ab and 5Ba, 5Bb are fixedly supported on the insulating boards 11A and 11B by thermocompression bonding. In the thermocompression bonding in this case, the relation $\alpha 1 < \alpha 2$ is established between the linear expansion coefficient $\alpha 1$ of each conductor pattern 14 on which the bonding recesses 14f, 14g, 14o, 14p, and 14q are formed and the linear expansion coefficient $\alpha 2$ of the external connection terminals 4A, 4B, 4C and the control terminals 5Aa, 5Ab, 5Ba, 5Bb bonded to the bonding recesses 14f, 14g, 14o, 14p, and 14q. That is, a copper plate whose linear expansion coefficient $\alpha 1$ corresponds to $\alpha 1=16.5 \times 10^{-6}$ is used as each conductor pattern 14 and an aluminum(Al)-based material whose linear expansion coefficient $\alpha 2$ corresponds to $\alpha 2=23.1 \times 10^{-6}$ is used as the external connection terminals 4A, 4B, 40 and the control terminals 5Aa, 5Ab, 5Ba, 5Bb.

The external connection terminals 4A, 4B, 4C and the control terminals 5Aa, 5Ab, 5Ba, 5Bb are inserted into the bonding recesses 14f, 14g, 14o and 14p, 14q through the metal fine particle containing adhesive 21. The temperature is increased to a bonding temperature of about 250° C. to 300° C. in the state in which each of the external connection terminals 4A, 4B, 4C and the control terminals 5Aa, 5Ab, 5Ba, 5Bb is axially pressurized against the bottom bonding surface F1 side by a predetermined jig. On this occasion, the linear expansion coefficient $\alpha 2$ of each of the external connection terminals 4A, 4B, 4C and the control terminals 5Aa, 5Ab, 5Ba, 5Bb is set to be larger than the linear expansion coefficient $\alpha 1$ of each of the bonding recesses 14f, 14g, 14o, 14p and 14q. Therefore, with the temperature rising, the radial thermal expansion amount of each of the external connection terminals 4A, 4B, 4C and the control terminals 5Aa, 5Ab, 5Ba, 5Bb becomes larger than the radial thermal expansion amount of each of the bonding recesses 14f, 14g, 14o, 14p and 14q so as to generate thermal stress therebetween. The thermal stress acts as pressurizing force on the circumferential bonding surface F2 between the outer circumferential surface of each of the external connection terminals 4A, 4B, 4C and the control terminals 5Aa, 5Ab, 5Ba, 5Bb and the inner circumferential surface of each of the bonding recesses 14f, 14g, 14o, 14p and 14q.

Accordingly, the pressurizing force acts on both the bottom bonding surface F1 and the circumferential bonding surface F2 between each of the external connection terminals 4A, 4B, 4C and the control terminals 5Aa, 5Ab, 5Ba, 5Bb and each of the bonding recesses 14f, 14g, 14o, 14p and 14q so that thermocompression bonding can be achieved in both the bottom bonding surface F1 and the circumferential bonding surface F2. As a result, the total bonding area of the thermocompression bonding between the external connection terminals 4A, 4B, 4C and the control terminals 5Aa, 5Ab, 5Ba, 5Bb and the bonding recesses 14f, 14g, 14o, 14p and 14q can be increased so that the bonding strength of the thermocompression bonding can be improved. Thus, the reliability of the thermocompression bonding can be improved.

Figure 7A:
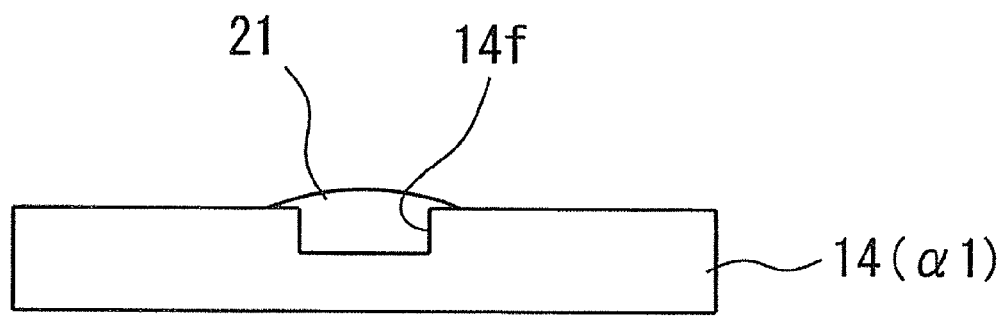
FIGS. 7A and 7B are views showing steps of a conventional thermocompression bonding method.
Figure 7B:
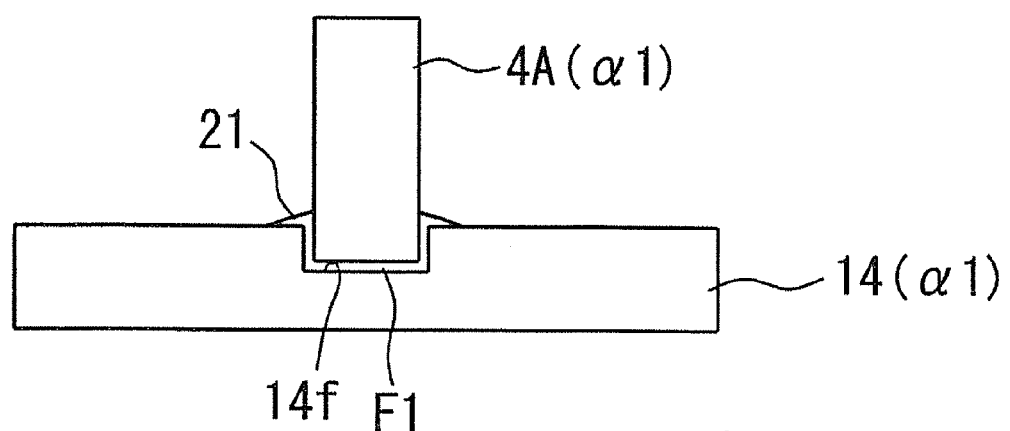

Incidentally, according to a background-art example, as shown in FIGS. 7A and 7B, both the material of the conductor pattern 14 where the bonding recess 14f is formed and the material of the external connection terminal 4A are made of copper. That is, materials whose linear expansion coefficients coincide with each other are used as the material of the conductor pattern 14 and the material of the external connection terminal 4A. In the state in which paste-like solder has been applied to the bonding recess 14f (see FIG. 7A), the external connection terminal 4A is inserted into the bonding recess 14f. Then, pressurizing force is applied to the upper end side of the external connection terminal 4A by a predetermined jig (see FIG. 7B). In this state, the temperature is increased, for example, to a bonding temperature of about 250° C. to 300° C. In this manner, thermocompression bonding between the external connection terminal 4A and the bonding recess 141 is achieved.

In the case of the background-art example, the linear expansion coefficient of the bonding recess 14f coincides with the linear expansion coefficient of the external connection terminal 4A to be bonded to the bonding recess 14f. However, the radial thermal expansion amounts of the both caused by the temperature rise coincide with each other or the radial thermal expansion amount of the bonding recess 14f is larger than the radial thermal expansion amount of the external connection terminal 4A because the diameter of the bonding recess 14f is somewhat larger than the outer diameter of the external connection terminal 4A.

Accordingly, due to no big difference between the radial thermal expansion amount of the external connection terminal 4A and the radial thermal expansion amount of the bonding recess 14f at the time of the temperature rise, pressurizing force does not act on the circumferential bonding surface between the outer circumferential surface of the external connection terminal 4A and the inner circumferential surface of the bonding recess 14f. As a result, pressurizing force acts only on the bottom bonding surface F1 between the bottom of the external connection terminal 4A and the bottom of the bonding recess 14f. Thus, thermocompression bonding is achieved only in the bottom bonding surface F1. Accordingly, y, the thermocompression bonding area is reduced to lower the certainty of the thermocompression bonding. Thus, the reliability of the bonding is lowered.

On the other hand, according to the embodiment, the thermocompression bonding is achieved not only in the bottom bonding surface F1 but also in the circumferential bonding surface F2 as described above. Accordingly, the bonding strength of the thermocompression bonding can be improved and the reliability thereof can be improved surely in comparison with the background-art example.

In addition, in order to make pressurizing force act on the circumferential bonding surface F2, it is not necessary to use a special jig but the thermocompression bonding can be achieved easily in the circumferential bonding surface F2 by a simple method of setting the linear expansion coefficient of the external connection terminal 4A to be larger than the linear expansion coefficient of the bonding recess 14f.

Further, the reliability of the power semiconductor module 1 as a whole can be improved and the yield rate for manufacturing the power semiconductor module 1 can be also improved.

Incidentally, although the first embodiment has been described in the case where the insulating boards 11A and 11B of the power semiconductor module 1 are separate from each other, the invention is not limited thereto. The invention can be also applied to the case where the insulating boards 11A and 11B are integrated.

In addition, although the first embodiment has been described in the case where the bonding recess is shaped like a circle in section and the external connection terminal to be bonded to the bonding recess is shaped like a column, the invention is not limited thereto. Any desirable shapes can be used as the shape of the bonding recess and the shape of the external connection terminal as long as the shapes allow pressurizing force to act on the bonding surface due to a difference in thermal expansion.

Incidentally, although the first embodiment has been described in the case where the thermocompression bonding structure and the thermocompression bonding method according to the invention are applied to the power semiconductor module 1, the invention is not limited thereto. That is, the invention can be applied to the case where thermocompression bonding is performed between a first member and a second member.

In this case, the first member and the second member are not limited to the combination of the bonding recess and the rod-like member. Alternatively, the following configuration may be made. That is, a bonding member such as metal fine particle containing adhesive may be interposed in a bonding surface between the first member and the second member, and a support member whose linear expansion coefficient is smaller than each of the linear expansion coefficients of the first member and the second member may be used to enclose and support the first member and the second member. When the temperature is increased in this state, pressurizing force generated by thermal stress can act on the bonding surface between the first member and the second member. Thus, thermocompression bonding can be achieved between the first member and the second member. In brief, the first member and the second member may be disposed so that thermal stress can act as pressurizing force on the bonding surface due to a difference in linear expansion coefficient between the first and second members.

In addition, the first embodiment has been described in the case where the conductor patterns 14 serving as the first members are made of copper, and the external connection terminals 4A to 4C and the control terminals 5Aa, 5Ab and 5Ba, 5Bb serving as the second members are made of aluminum or an aluminum alloy. The invention is not limited thereto. Any metal materials may be used as the materials of each first member and each second member for achievement of thermocompression bonding as long as the linear expansion coefficient of the second member is larger than the linear expansion coefficient of the first member.

Next, a second embodiment of the invention will be described with reference to FIGS. 8A-8D.

The second embodiment is designed so that thermocompression bonding is achieved between each third member and each fourth member between which there is no big difference in linear expansion coefficient.

That is, in the second embodiment, as shown in FIGS. 8A to 8D, an external connection terminal 4A will be described as a representative on the assumption that conductor patterns 14 of insulating boards 11A and 11B of a power semiconductor module 1 as third members and external connection terminals 4A to 4C and control terminals 5Aa, 5Ab, 5Ba, 5Bb as fourth members are pressurized and heated to be bonded to each other in the same manner as in the first embodiment.

In the second embodiment, both the external connection terminals 4A to 4C and the control terminals 5Aa, 5Ab, 5Ba, 5Bb are formed as copper rods from the same material as copper plates constituting the conductor patterns 14 of the insulating boards 11A and 11B. In addition, as shown in FIG. 8A, a cylinder-shaped annular protrusion 31 is formed in place of the bonding recess in the first embodiment so as to be located in a position where each of the external connection terminals 4A to 4C and the control terminals 5Aa, 5Ab, 5Ba, 5Bb is to be bonded to each of the conductor patterns 14 of the insulating boards 11A and 11B. Metal fine particle containing adhesive 32 containing metal fine particles such as Ag fine particles is applied as a bonding member to the interior of the annular protrusion 31, for example, to be heaped up.

Next, as shown in FIG. 8B, an annular jig 33 for restraining the ring-like annular protrusion 31 from thermally expanding radially outward is mounted on the outer side of the annular protrusion 31 so as to generate a very small gap therebetween. The annular jig 33 is, for example, made of titanium or a titanium alloy whose linear expansion coefficient is smaller than a linear expansion coefficient $\alpha 1$ ($=16.5 \times 10^{-6}$) of the external connection terminals 4A to 4C and the control terminals 5Aa, 5Ab, 5Ba, 5Bb and the insulating boards 11A and 11B to which the external connection terminals 4A to 4C and the control terminals 5Aa, 5Ab, 5Ba, 5Bb should be bonded. Here, the linear expansion coefficient $\alpha 3$ of titanium corresponds to $\alpha 3 = 8.6 \times 10^{-6}$. The linear expansion coefficient of titanium is about half as high as that of copper but the hardness of titanium is larger than that of copper.

Next, as shown in FIG. 8C, the external connection terminal 4A is inserted into the annular protrusion 31 and pressing force for pressing the external connection terminal 4A downward is applied to the upper end thereof by means of a predetermined jig. In this state, the external connection terminal 4A inserted into the annular protrusion 31 is heated by a heater provided in the jig or put into a heating furnace and heated so as to increase the temperature of the external connection terminal 4A and the annular protrusion 31 to a predetermined bonding temperature, for example, of 250° C. to 300° C.

When the temperature of the annular protrusion 31 and the external connection terminal 4A is increased in this manner, the annular protrusion 31 and the external connection terminal 4A thermally expand equally because the linear expansion coefficients of the two coincides with each other. However, since the linear expansion coefficient α3 of the annular jig 33 mounted on the outer circumference of the annular protrusion 31 is about half as high as the linear expansion coefficient α1 of the annular protrusion 31 and the external connection terminal 4A, the thermal expansion of the annular protrusion 31 in the radial direction is blocked by the annular jig 33. Therefore, pressurizing force acts on a circumferential bonding surface F2 between an inner circumferential surface of the annular protrusion 31 and an outer circumferential surface of the external connection terminal 4A so that thermocompression bonding can be achieved therein. In addition, pressurizing force acts on a bottom bonding surface F1 between the inner-side bottom of the annular protrusion 31 and the bottom of the external connection terminal 4A due to the jig so that thermocompression bonding can be achieved therein.

The heating of the annular protrusion 31 and the external connection terminal 4A is then stopped to reduce the temperature therein to room temperature. The annular jig 33 is then removed from the annular protrusion 31. Thus, a thermocompression bonding structure in which thermocompression bonding is achieved between the annular protrusion 31 and the external connection terminal 4A by the metal fine particles is formed as shown in FIG. 8D.

Also in the thermocompression bonding structure according to the second embodiment, thermocompression bonding is achieved in both the bottom bonding surface F1 and the circumferential bonding surface F2 in the same manner as in the aforementioned first embodiment. Accordingly, thermocompression bonding between the annular protrusion 31 and the external connection terminal 4A can be performed surely so that sufficient bonding strength can be obtained. Thus, the reliability of the bonding can be improved. Accordingly, the reliability of the thermocompression bonding structure can be improved and hence the reliability of the power semiconductor module 1 can be improved.

Figure 9:
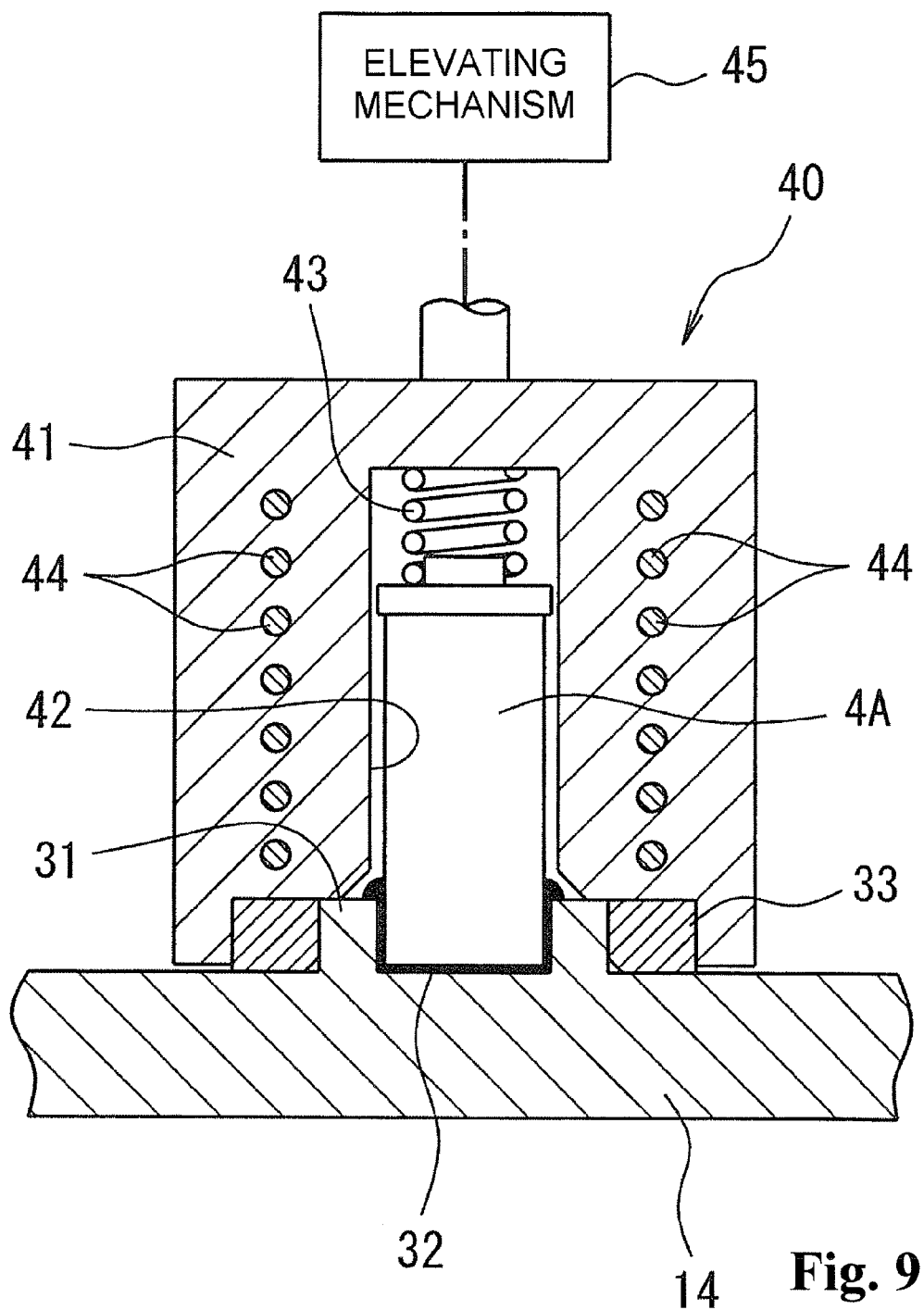
FIG. 9 is a cross-sectional view showing a thermocompression bonding device which can be applied to the thermocompression bonding method in FIGS. 8A-8D.

Incidentally, a thermocompression bonding device 40, for example, having a configuration shown in FIG. 9 can be used as the thermocompression bonding device used for the thermocompression bonding.

The thermocompression bonding device 40 has a bonding device body 41 which is, for example, formed into a bottomed cylindrical shape from titanium or a titanium alloy (with a linear expansion coefficient $\alpha 3=8.6\times 10^{-6}$). The aforementioned annular protrusion 33 is fixed to an inner circumferential surface of a lower end of the bonding device body 41. A guide hole 42 whose inner diameter is larger than an outer diameter of the external connection terminal 4A and into which the external connection terminal 4A is inserted while guided is formed on the upper end side of the annular jig 33. A pressure spring 43 for applying predetermined pressing force to the external connection terminal 4A is fixed to the upper end side of the guide hole 42.

Incidentally, an inner surface of a lower end of the annular jig 33 and an inner surface of a lower end of the guide hole 42 are designed to be, for example, C-chamfered to make it possible to insert the annular protrusion 31 and the external connection terminal 4A thereto easily. In addition, a heater 44 is built in the bonding device body 41 so that the temperature of the annular protrusion 31 and the external connection terminal 4A can be increased to a predetermined thermocompression bonding temperature (for example, 250° C. to 300° C.) by the heater 44.

The thermocompression bonding device 40 is supported by an elevating mechanism 45 so that the thermocompression bonding device 40 can be moved up/down relatively to the annular protrusion 31 and the external connection terminal 4A.

Before the thermocompression bonding device 40 is used, the external connection terminal 4A is inserted into the annular protrusion 31 of the conductor pattern 14 which has been coated with the metal fine particle containing adhesive 32 on the inner surface side of the annular protrusion 31. In this state, the thermocompression bonding device 40 is positioned and arranged so that the outer circumferential surface of the annular protrusion 31 faces the inner circumferential surface of the annular jig 33 of the thermocompression bonding device 40.

When the bonding device body 41 is moved down by the elevating mechanism 45 in this state, the annular jig 33 is moved down to be engaged with the outer circumferential surface of the annular protrusion 31. In accordance with the down movement of the bonding device body 41, the external connection terminal 4A is inserted into the guide hole 42 so that the external connection terminal 4A is pressed from above by predetermined pressing force by the pressure spring 43 disposed in the upper end of the guide hole 42. In this manner, pressurizing force acts on the bottom bonding surface F1 between the inner-side bottom of the annular protrusion 31 and the bottom of the external connection terminal 4A.

When the bonding device body 41 is moved down to a predetermined position so that the outer circumferential surface of the annular protrusion 31 is engaged with the inner circumferential surface of the annular jig 33, the down movement of the bonding device body 41 by the elevating mechanism 45 is stopped. Then, electricity is conducted to the heater 44 to increase the temperature of the annular protrusion 31 and the external connection terminal 4A to a predetermined thermocompression bonding temperature. When the annular protrusion 31 and the external connection terminal 4A are kept at the predetermined thermocompression bonding temperature for a predetermined time, a binder component of the metal fine particle containing adhesive is dissolved so that the metal fine particles are exposed.

Temperature rising in the annular protrusion 31 and the external connection terminal 4A leads to simultaneous thermal expansion in the annular protrusion 31 and the external connection terminal 4A. Due to no difference in linear expansion coefficient between the annular protrusion 31 and the external connection terminal 4A, pressurizing force does not act on the circumferential bonding surface F2 between the inner circumferential surface of the annular protrusion 31 and the outer circumferential surface of the external connection terminal 4A. However, the annular jig 33 engaged with the outer circumference of the annular protrusion 31 has a linear expansion coefficient α3 smaller than the linear expansion coefficient α1 of each of the annular protrusion 31 and the external connection terminal 4A. Therefore, the thermal expansion of the annular protrusion 31 going outward in the radial direction is blocked by the annular jig 33.

Therefore, the thermal expansion of the annular protrusion 31 is directed inward in the radial direction. In cooperation with thermal expansion of the external connection terminal 4A going outward in the radial direction, pressurizing force acts on the circumferential bonding surface F2 between the inner circumferential surface of the annular protrusion 31 and the outer circumferential surface of the external connection terminal 4A. Thus, thermocompression bonding is also achieved in the circumferential bonding surface F2.

Then, after a lapse of a predetermined time, the electricity conducted to the heater 44 is stopped for cooling. Then, the thermocompression bonding device 40 is moved up by the elevating mechanism 45 so as to move up the annular jig 33 and detach the annular jig 33 from the outer circumferential surface of the annular protrusion 31.

When the thermocompression bonding device 40 is used in this manner, thermocompression bonding can be achieved automatically and easily. On this occasion, similar thermocompression bonding devices are formed respectively for the other external connection terminals 4B and 4C and the control terminals 5Aa, 5Ab and 5Ba, 5Bb to be pressurized and heated to be bonded, and the thermocompression bonding devices 40 are fixedly positioned on one attachment plate so as to be opposed to the external connection terminals 4B and 4C and the control terminals 5Aa, 5Ab and 5Ba, 5Bb. When the attachment plate is moved up/down by the elevating mechanism 45, the external connection terminals 4A to 4C and the control terminals 5Aa, 5Ab and 5Ba, 5Bb can be pressurized and heated to be bonded into the annular protrusions 31 simultaneously.

Incidentally, the insulating boards 11A and 11B in the first and second embodiments are not limited to the aforementioned configuration. Alternatively, so-called AMB (Active Metal Brazing) boards in which ceramics and copper are brazed and copper is patterned by etching, or DCB (Direct Copper Bonding) boards in which ceramics substrates and copper are bonded to each other directly may be used. In addition, alumina ($Al_2O_3$), aluminum nitride (AlN), silicon nitride ($Si_3N_4$) etc. may be used as the material of the ceramics boards. Further, resin boards may be used in place of the ceramics boards. In brief, any boards can be used as long as the boards can keep insulation.

In addition, although the first and second embodiments have been described in the case where IGBTs are built in the first semiconductor chips 12A, the invention is not limited thereto. Power field effect transistors may be built in the first semiconductor chips 12A or other voltage control type semiconductor elements may be built in the first semiconductor chips 12A.

In addition, although the first and second embodiments have been described in the case where a plurality of first semiconductor chips 12A and a plurality of second semiconductor chips 12B are disposed on the insulating boards 11A and 11B, the invention is not limited thereto. For example, in the case where diodes with transistors built in can be used or in the case where a synchronous rectification system is used, the free wheeling diodes may be dispensed with so that the first and second semiconductor chips 12A and 12B can be constituted by only power semiconductor elements such as power MOSFETs or IGBTs.

In addition, according to the invention, a desired circuit configuration can be obtained only by a combination of terminal connections in the semiconductor module. Accordingly, the invention is not limited to the aforementioned inverter device for power conversion. The invention can be applied to any other semiconductor device such as another power conversion device using the power semiconductor module or a switching IC for high frequency applications.

What is claimed is:

1. A thermocompression bonding structure, comprising:
   a first member including a metal conductor pattern having a bonding recess;
   a second member fitted in the bonding recess of the first member and having a linear expansion coefficient higher than that of the first member, the second member being a metal; and
   metal fine particles disposed in the bonding recess of the first member as a bonding material to thermocompression bond the first and second members, and having a surface thereof covered with a volatile binder material,
   wherein the first and second members are structured so that when temperatures of the first and second members are increased, the second member thermally expands more than the first member to generate thermal stress between the first member and the second member as a pressurizing force on a bonding portion between the first and second members to thermocompression bond the first member and the second member, and
   when temperatures of the metal fine particles having the surface covered with the volatile binder material are increased, the volatile binder material covering the metal fine particles is decomposed to expose the metal fine particles, and the metal fine particles are sintered in the bonding portion to thermocompression bond the first and second members.

2. The thermocompression bonding structure according to claim 1, wherein the the bonding recess has a circular cross-section, and the second member is a terminal member having a columnar shape.

3. The thermocompression bonding structure according to claim 1, wherein the metal conductor pattern includes a plurality of bonding recesses, and the second member includes a plurality of external connection terminals fitted in the plurality of bonding recesses respectively.

4. The thermocompression bonding structure according to claim 3, wherein the binder material includes an organic substance containing carboxylic acids, alcohols, or amines.

* * * * *

UNITED STATES PATENT AND TRADEMARK OFFICE
CERTIFICATE OF CORRECTION

PATENT NO. : 9,579,746 B2
APPLICATION NO. : 14/224738
DATED : February 28, 2017
INVENTOR(S) : Yoshito Kinoshita et al.

It is certified that error appears in the above-identified patent and that said Letters Patent is hereby corrected as shown below:

In the Specification

Please change Column 5, Line 64, from "... 14p and 14 q ..." to --... 14 p and 14q ...--.

Please change Column 7, Line 59, from "... the lea side ..." to --... the left side ...--.

Please change Column 10, Line 50, from "... recess 141 ..." to --... recess 14f ...--.

Please change Column 11, Line 7, from "... Accordingly, y, the ..." to --... Accordingly, the ...--.

Please change Column 15, Line 17, from "... devices are ..." to --... devices 40 are ...--.

Signed and Sealed this
Sixth Day of June, 2017

Michelle K. Lee
*Director of the United States Patent and Trademark Office*